United States Patent [19]

Hashimoto

[11] Patent Number: 6,018,688
[45] Date of Patent: Jan. 25, 2000

[54] APPARATUS AND METHOD FOR DETERMINING WHETHER TO LOAD A WORKPIECE INTO A WORKING DEVICE USING STORED AND UPDATED STATUS FLAGS

[75] Inventor: Makoto Hashimoto, Kanagawa, Japan

[73] Assignee: Sony Corporation, Japan

[21] Appl. No.: 08/654,906

[22] Filed: May 29, 1996

[30] Foreign Application Priority Data

Jun. 6, 1995 [JP] Japan .............................. PO7-139166

[51] Int. Cl.[7] .............................. G06F 19/00; G06G 7/66; B29C 39/00
[52] U.S. Cl. .......................... 700/215; 700/121; 700/95; 700/184; 438/8; 438/51
[58] Field of Search ...................... 364/468.28, 478.03, 364/478.01, 431.1, 474.26, 468.01, 550, 131–133, 138, 492, 551.01; 425/135; 438/5, 7, 8, 51

[56] References Cited

U.S. PATENT DOCUMENTS

| | | | |
|---|---|---|---|
| 4,736,320 | 4/1988 | Bristol ..................................... | 364/300 |
| 5,062,052 | 10/1991 | Sparer et al. ............................ | 364/473 |
| 5,105,362 | 4/1992 | Kotani ..................................... | 364/468 |
| 5,372,471 | 12/1994 | Wu ......................................... | 414/786 |
| 5,443,346 | 8/1995 | Murata et al. ........................... | 414/222 |
| 5,529,630 | 6/1996 | Imahashi et al. ....................... | 118/665 |
| 5,551,165 | 9/1996 | Turner et al. .............................. | 34/404 |
| 5,551,309 | 9/1996 | Goossens et al. ......................... | 73/863 |
| 5,557,545 | 9/1996 | Loffel et al. ............................. | 364/550 |
| 5,563,095 | 10/1996 | Frey ......................................... | 437/141 |
| 5,580,419 | 12/1996 | Berenz ................................. | 156/628.1 |
| 5,609,585 | 3/1997 | Botten et al. ........................... | 604/332 |
| 5,621,982 | 4/1997 | Yamashita et al. ....................... | 34/203 |
| 5,626,820 | 5/1997 | Kinkead et al. ........................ | 422/122 |

*Primary Examiner*—William Grant
*Assistant Examiner*—Ramesh Patel
*Attorney, Agent, or Firm*—Rader, Fishman & Grauer; Ronald P. Kananen

[57] ABSTRACT

An apparatus and a method for production control whereby checks for cross contamination removal are made automatically to control whether to load a workpiece into a given working device depending on the work status of that workpiece. A storage unit stores status flags each indicating the work status of the workpiece. The unit also stores either a post-work status flag indicating the work status which the workpiece will be in after status-flag-designated processing by the working device, or a warning flag prohibiting the processing of the workpiece by the working device. A computing unit reads from the storage unit the status flags of the workpiece before the workpiece is loaded into the working device. The computing unit further determines whether the workpiece is suitable for being loaded into the working device in accordance with either the post-work status flag or the warning flag corresponding to the status flags of the workpiece in relation to the working device in question.

17 Claims, 5 Drawing Sheets

FIG. 2

| WORK / STATUS FLAG | RESIST | PREDEPOSITION OXIDE FILM | TUNGSTEN SILICIDE | METAL |
|---|---|---|---|---|
| C  | × | × | × | × |
| W  | × | × | ◎ | × |
| A  | × | × | ○ | ◎ |
| N  | × | ◎ | ○ | × |
| RC | ◎ | × | × | × |
| RW | ◎ | × | ◎ | × |
| RA | ◎ | × | ○ | ◎ |

| SPUTTERING SYSTEM | |
|---|---|
| BEFORE WORK | AFTER WORK |
| C → | A |
| W → | A |
| A → | A |
| N → | A |
| RC → | × |
| RW → | × |
| RA → | × |

| THERMAL OXIDATION FURNACE | |
|---|---|
| BEFORE WORK | AFTER WORK |
| C → | C |
| W → | × |
| A → | × |
| N → | × |
| RC → | × |
| RW → | × |
| RA → | × |

| FILM THICKNESS MEASUREMENT EQUIPMENT | |
|---|---|
| BEFORE WORK | AFTER WORK |
| C → | C |
| W → | W |
| A → | A |
| N → | N |
| RC → | RC |
| RW → | RW |
| RA → | RA |

FIG. 5

(STATUS FLAGS OF THE SECOND GROUP) ⌐J1

(STATUS FLAGS OF THE FIRST GROUP)

|   | C | W | A | N | RC | RW | RA |
|---|---|---|---|---|----|----|----|
| C | C | W | A | N | RC | RW | RA |
| W | — | W | A | N | RW | RW | RA |
| A | — | — | A | A | RA | RA | RA |
| N | — | — | — | N | RW | RW | RA |
| RC | — | — | — | — | RC | RW | RA |
| RW | — | — | — | — | — | RW | RA |
| RA | — | — | — | — | — | — | RA |
| K | — | — | — | — | — | — | — |

| LOT STATUS FLAGS | C | W | A | N | RC | RW | RA |
|---|---|---|---|---|----|----|----|
| CARRIER STATUS FLAGS | C | C | A | N | C | C | A |

APPARATUS AND METHOD FOR DETERMINING WHETHER TO LOAD A WORKPIECE INTO A WORKING DEVICE USING STORED AND UPDATED STATUS FLAGS

BACKGROUND OF THE INVENTION

The present invention relates to an apparatus and a method for production control whereby checks are made to determine if a workpiece to be loaded into a given working device is suitable for undergoing the work to be done by that particular device.

Recent years have seen an unremitting increase in the number of steps to fabricate semiconductor devices such as static random access memories (SRAMs), dynamic random access memories (DRAMs), and charge-coupled devices (CCDs) to accommodate their ever-increasing degrees of circuit integration. In the area of production control over such complicated semiconductor fabrication facilities, one crucial issue is the prevention of what is known as cross contamination across different processes or devices of production.

For example, if a wafer with a metal wiring substance such as aluminum formed thereon is inadvertently loaded into a gate oxidation furnace for thermal oxidation, the furnace will be contaminated by the metal. When the contaminated device is used to work on another lot of workpieces, the entire lot will be contaminated. The contaminated lot of workpieces will move on to other devices which are in turn polluted by the contaminated workpieces. Such a chain-reacting process of cross contamination, once taking place, accelerates over time and causes extensive damage throughout the production line.

In related art production control setups, engineers in charge of production processes and devices are supposed to check for any signs of cross contamination in each step of fabrication. As the number of fabricating steps increases, however, these checks tend to be performed insufficiently; some checks may be made incorrectly and some may even be neglected altogether.

SUMMARY OF THE INVENTION

It is therefore an object of the present invention to provide an apparatus and a method for production control whereby checks to prevent cross contamination are performed automatically.

In carrying out the invention and according to one aspect thereof, there is provided a production control apparatus for controlling whether to load a workpiece into a working device depending on the work status of the workpiece. The production control apparatus comprises: a storage unit for storing status flags each indicating the work status of the workpiece, the storage unit further storing either a post-work status flag indicating the work status which the workpiece bearing the status flags will be in after undergoing status-flag-designated processing by the working device, or a warning flag prohibiting the processing of the workpiece by the working device; a computing unit for reading from the storage unit the status flags of the workpiece before the workpiece is loaded into the working device, the computing unit further judging whether the workpiece is suitable for being loaded into the working device in accordance with either the post-work status flag or the warning flag corresponding to the status flags of the workpiece in relation to the working device in question; and output terminals for outputting the result of the judgment by the computing unit.

According to another aspect of the invention, there is provided a production control method for controlling the suitability of whether to load a workpiece into a working device depending on the work status of the workpiece. The production control method comprises the steps of: setting in advance status flags each indicating the work status of the workpiece; storing either a post-work status flag indicating the work status which the workpiece bearing the status flags will be in after undergoing status-flag-designated processing by the working device, or a warning flag prohibiting the processing of the workpiece by the working device; and reading the status flags from the workpiece before the workpiece is loaded into the working device in order to determine whether the workpiece is suitable for being loaded into the working device in accordance with either the post-work status flag or the warning flag corresponding to the status flags of the workpiece in relation to the working device in question.

With the production control apparatus according to the invention, the storage unit stores status flags each indicating the work status of the workpiece in question, and further stores either a post-work status flag indicating the work status which the workpiece bearing the status flags will be in after undergoing status-flag-designated processing by the working device, or a warning flag prohibiting the processing of the workpiece by the working device. Before the workpiece is loaded into the working device, the computing unit reads from the storage unit the status flags of the workpiece and retrieves through computation either the post-work status flag or the warning flag corresponding to the status flags of the workpiece in relation to the working device in question. The result of the computation is sent to output terminals. If the post-work status flag is transmitted from the computing unit to the output means, the workpiece is automatically allowed to be loaded into the working device without the possibility of contaminating it. If the warning flag is sent to the output terminals, the workpiece is automatically barred from entering the working device for fear of contamination.

With the production control method according to the invention, before the workpiece in question is loaded into a given working device, the status flags attached in advance to the workpiece are read out, and either the post-work status flag or the warning flag associated with the status flags is acquired. If the post-work status flag is obtained, the workpiece is determined to be suitable for being loaded into the working device without the possibility of contaminating it. If the warning flag is acquired, the workpiece is determined to be liable to contaminate the working device upon entry thereinto. The inventive method determines in advance the suitability of whether to load a given workpiece into a given working device, and the processing by the working device on the workpiece in question is continued or canceled accordingly.

These and other objects, features and advantages of the invention will become more apparent upon a reading of the following description and appended drawings.

BRIEF DESCRIPTION OF THE DRAWINGS

FIG. 2 is a view showing how a status flag table for use with the invention is composed illustratively;

FIGS. 3A through 3C are views showing examples of suitability tables for use with the embodiment;

FIG. 5 is a view depicting how a status flag conversion table for use with the invention is composed illustratively; and FIG. 6 is a view indicating how a lot status flag-to-carrier status flag conversion table is constituted illustratively.

DESCRIPTION OF THE PREFERRED EMBODIMENTS

Figure 1:
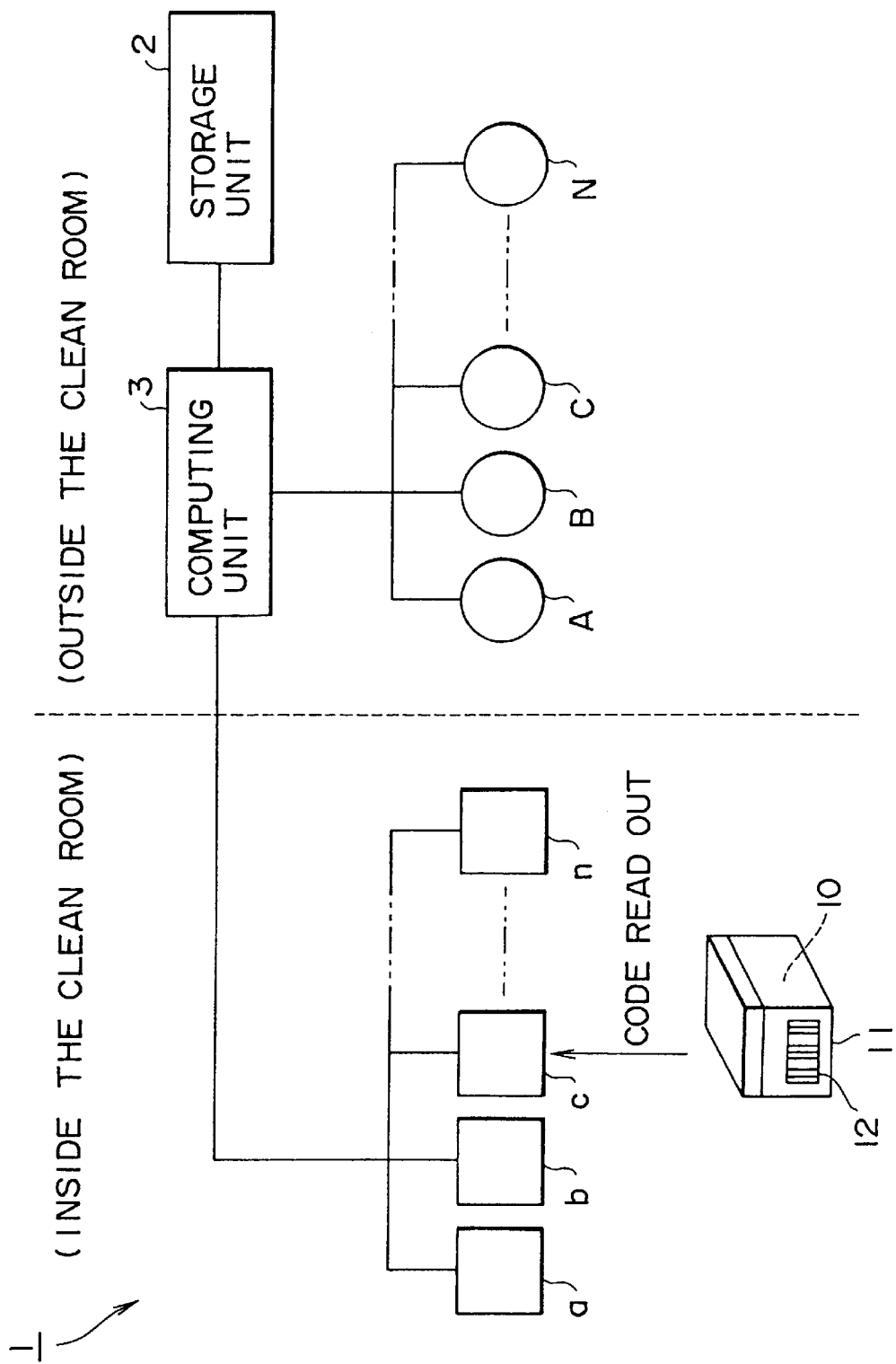
FIG. 1 is a block diagram of a production control apparatus embodying the invention.

Preferred embodiments of the invention will now be described with reference to the accompanying drawings. FIG. 1 is a block diagram of a production control apparatus 1 practiced as one embodiment of the invention. The production control apparatus 1 constitutes a system for production control used when a wafer 10 (i.e., workpiece) is loaded into working devices such as film forming and measuring equipments (not shown) for semiconductor fabrication. The production control apparatus 1 primarily includes input/output terminals a, b, c, . . . , n furnished corresponding to the working devices inside a clean room; input/output terminals A, B, C, . . . , N installed outside the clean room; a storage unit 2, and a computing unit 3.

Each of the input/output terminals a, b, c, . . . , n inside the clean room includes input means (e.g., keyboard) and output means (e.g., display). The input means is used to send suitable production history information, measurements and setting registered information necessary for production control from each working device (not shown) to the computing unit 3 outside the clean room, and on to the storage unit 2 for storage therein. The output means is used to display stored information coming from the storage unit 2 and computed results from the computing unit 3, both units located outside the clean room. The input/output terminals a, b, c, . . . , n are each equipped with optical reading means (not shown) for reading a bar code 12 from a carrier 11 that conveys the wafer 10 between production processes inside the clean room. The optical reading means may be replaced by other means for reading an identification code than the bar code 12.

When the wafer 10 on the carrier 11 reaches a working device for processing thereby in a production process inside the clean room, the input/output terminal (any one of a, b, c, . . . , n) corresponding to the working device in question reads optically the bar code 12 from the carrier 11. The read-out information is sent to the computing unit 3 outside the clean room. On the basis of the received information about the bar code 12, the computing unit 3 retrieves suitable production control information from the storage unit 2 and returns the retrieved information to the input terminal (one of a, b, c, . . . , n) in question inside the clean room. Given the response from the computing unit 3, the applicable input/output terminal carries out predetermined work procedures accordingly.

In the production control apparatus 1 embodying the invention, the storage unit 2 stores status flags indicating the work status of each workpiece (i.e., wafer 10) as production control information with a view to primarily forestalling the incidence of cross contamination.

FIG. 2 is a view showing how a status flag table J stored in the storage unit 2 is composed illustratively. The status flag table J defines the correspondence between status flags each defining the type of processing or the status of work regarding the wafer 10 (see FIG. 1) on the one hand, and the contents of work applicable to each flag on the other hand. For example, a status flag C defined in the table J indicates the state in which the wafer 10 in question is free from any resist, predeposition oxide film, tungsten silicide or metal such as aluminum.

A status flag A in the status flag table J stands for the state in which the wafer 10 has the metal formed thereon, may have tungsten silicide furnished thereon as needed, and is free from any resist or predeposition oxide film. That is, of the kinds of work corresponding to the status flag A in FIG. 2, the kind of work marked with a double circle (⊚) is that which is performed invariably, the kind of work with a single circle (○) is that which is optionally performed as needed, and those with an X each are the kinds of work that are not done. The same holds for the other status flags, with the symbols ⊚, ○ and X indicating the same kinds of work as mentioned above.

The status flag table J is predetermined at the stage of process design for the target semiconductor device that will be fabricated, and is stored in the storage unit 2. The contents of the status flag table J may be changed, supplemented, deleted or otherwise edited as needed from any of the input/output terminals a, b, c, . . . , n inside the clean room or of the input/output terminals A, B, C, . . . , N outside the clean room (see FIG. 1).

In addition to the status flag table J, the storage unit 2 outside the clean room accommodates a suitability table corresponding to each of the working devices (not shown). Each suitability table, furnished with a view to forestalling cross contamination, is referenced to check whether the wafer 10 having a specific status flag is allowed to be loaded into a particular working device corresponding to the table.

FIGS. 3A through 3C show typical suitability tables T, T' and T" that are stored in the storage unit 2. Specifically, FIGS. 3A, 3B and 3C indicate respectively the suitability tables T, T' and T" corresponding to a sputtering system, a thermal oxidation furnace and film thickness measurement equipment. Each of the tables contains status flags each denoting the state which the wafer 10 (FIG. 1) bearing the status flag will be in after being loaded to and processed by the working device in question, and/or warning flags (symbol X ).

In the example of the sputtering system in FIG. 3A, suppose that a wafer 10 having status flags C, W, A and N are loaded to and processed by the system. In that case, after the processing is completed, the status flags are shown changing to a post-work status flag A each in the table. A wafer 10 having any of status flags RC, RW and RA is shown to be banned from being loaded to and processed by the system because of the high possibility of cross contamination, as indicated by the warning flag.

In the example of the thermal oxidation furnace in FIG. 3B, suppose that a wafer 10 having the status flag C is loaded to and processed by the furnace. In that case, the status flag C remains the same in the table after the processing is completed. A wafer 10 bearing any other status flag is shown to be banned from being loaded to and processed by the furnace because of the high possibility of cross contamination, as indicated by the warning flag.

In the case of the film thickness measurement equipment in FIG. 3C, all status flags before work remain unchanged after work. The suitability tables T, T' and T" indicate how each of the status flags before work changes after work done by a given working device. Where work on a workpiece with a given status flag is shown to result in the same or a different status flag, that means the kind of work in question is allowed to be performed on the workpiece. If work on a workpiece is shown leading to a warning flag, that means the work in question is not allowed to be performed on the workpiece.

Other working devices for other processes other than those cited with reference to FIGS. 3A through 3C are also provided with a suitability table each. These tables are stored in the storage unit 2 (FIG. 1). Suitability tables are entered into the storage unit 2 from any of the input/output terminals a, b, c, . . . , n inside the clean room or from any of the input/output terminals A, B, C, . . . , N outside the clean room (FIG. 1).

In the production control apparatus 1 of FIG. 1 embodying the invention, read-out information about the bar code 12 on the carrier 11 brought to each of the working devices (not shown) is sent from the corresponding input/output terminal (one of a, b, c, . . . , n) to the computing unit 3. Given the read-out information, the computing unit 3 obtains through computation the status flag relevant to the work status of the wafer 10 in the current production step with reference to the status flag table J in FIG. 2.

The computing unit 3 then acquires illustratively from any of the suitability tables T, T' and T" (FIG. 3) the post-work status flag or warning flag associated with the status flag of the wafer 10 in relation to the working device in question. The resulting post-work status flag or warning flag is sent from the computing unit 3 to the corresponding input/output terminal (one of a, b, c, . . . , n) inside the clean room.

This allows the corresponding input/output terminal inside the clean room to judge automatically and unfailingly whether to load the wafer 10 into the working device in question for processing without the possibility of cross contamination.

More specifically, if a post-work status flag regarding the wafer 10 is sent from the computing unit 3 to the output means of the corresponding input/output terminal (one of a, b, c, . . . ,n), that means the work on the wafer 10 is allowed to be performed by the working device in question. If a warning flag is sent to the output means of the corresponding input/output terminal, that means the work on the wafer 10 is banned from being carried out by the working device in question because of the possibility of cross contamination.

Where an operator inside the clean room is charged with loading the wafer 10 into a given working device, the operator checks the displayed status flag or warning flag on the output means of the corresponding input/output terminal (one of a, b, c, . . . , n), to verify easily and unfailingly whether the wafer 10 transported so far is allowed to be loaded into the working device in question.

When the computing unit 3 sends a warning flag to any one of the input/output terminals a, b, c, . . . , n inside the clean room, the output means of the input/output terminal in question may display the received warning flag and emit a warning beep at the same time to make doubly sure that inadvertent loading of the workpiece does not take place. In another alternative, the receipt of the warning flag may be arranged to cause the production control apparatus 1 to lock its operation and forcibly to suspend all subsequent work.

The above-described production control apparatus 1 in operation ascertains unfailingly whether the wafer 10 on the carrier 11 transported up to a given working device in a given production process is suitable for being loaded to and processed by the working device in question. The apparatus 1 eliminates the possibility of inadvertent loading of the wafer into the wrong working device and thereby ensures that cross contamination is forestalled.

A production control method also embodying the invention will now be described with reference to the flowchart of FIG. 4. In step S1, a status flag table such as the one in FIG. 2 is established. Data are set in the status flag table primarily at the stage of process design for the target semiconductor device that will be fabricated. The settings are determined with respect to the kinds of work to be done on the wafer 10. The data in the status flag table may be changed, supplemented, deleted or otherwise edited as needed.

In step S2, suitability tables such as the tables T, T' and T" in FIGS. 3A through 3C are stored regarding the working devices involved. One suitability table is set for each working device in a given semiconductor fabrication process. In each suitability table, a post-work status flag is set corresponding to each status flag that allows the wafer 10 bearing that flag to be loaded to and processed by the working device in question; a warning flag (symbol X ) is set with respect to each status flag that bans the wafer 10 bearing that flag from being loaded to and processed by the working device in question.

Actual processing starts in step S3 following step S1 in which the status flag table J is set and step S2 in which the suitability tables are stored for the working devices involved. With the processing set in motion, the wafer 10 (FIG. 1) placed on the carrier 11 is transported successively to each of the working devices (not shown) whereby appropriate work is done on the wafer.

After the processing is inaugurated and the carrier 11 starts to be transported to each of the working devices, step S4 is reached. In step S4, the status flags applicable to the wafer 10 are read out. More specifically, the input/output terminal (a, b, c, . . . , n; see FIG. 1) associated with each of the working devices reads the bar code 12 off the carrier 11 and sends the read-out information to the computing unit 3. Upon receipt of the read-out information, the computing unit 3 references the storage unit 2 to obtain the applicable status flag of the transported wafer 10 on the basis of the status flag table J in FIG. 2. There are two cases in which to acquire a status flag. In one case, the status flag C attached on an untreated wafer 10 is regarded as the initial value, and the status flag to be read for a given wafer 10 is determined in accordance with the progress of work performed on the wafer relative to the initial status flag value C. In the other case, the status flag of a given wafer 10 is acquired from the correspondence between stored history information and the status flag table J. The status flag acquired in one of the two ways above is transmitted to the corresponding input/output terminal (one of a, b, c, . . . , n) inside the clean room.

In step S5, a post-work status flag or a warning flag for the wafer 10 transported so far is acquired relative to the working device in question before the wafer 10 is loaded into the device for processing. Acquisition of the post-work status flag or warning flag is effected by the computing unit 3 (FIG. 1) on the basis of the suitability table predetermined for the working device in question. That is, the computing unit 3 refers to one of the suitability tables such as the tables T, T' and T" in FIGS. 3A through 3C stored corresponding to the working devices, and obtains the post-work status flag or warning flag associated with the status flag of the wafer 10 in relation to the working device in question.

In step S6, the computing unit 3 outputs suitability information. Specifically, if a post-work status flag is acquired, the computing unit 3 sends that flag to the corresponding input/output terminal (one of a, b, c, . . . , n) indicating that the wafer 10 is allowed to be loaded to and processed by the working device in question; if a warning flag is obtained, the computing unit 3 outputs onto the input/output terminal that flag banning the wafer 10 from being loaded to and processed by the working device. In this manner, before the wafer 10 is loaded into a given working device for processing, checks are made accurately to determine whether such loading and processing of the wafer will result in cross contamination. This makes it possible to forestall the occurrence of cross contamination.

After appropriate work or processing is performed on the wafer 10 by a given working device, the pre-work status flag of the wafer 10 is replaced by the corresponding post-work status flag attached anew to the wafer illustratively in accordance with one of the suitability tables T, T' and T" in FIGS. 3A through 3C. The information representing the post-work status flag thus determined is sent as needed from the input/output terminal (a, b, c, . . . ,n) inside the clean room to the storage unit 2 for storage therein by way of the computing unit 3 outside the clean room.

At the next working device in the ensuing production process, the newly attached status flag of the wafer 10 (or a status flag obtained from history information) is regarded as a pre-work status flag. Again the suitability table associated with the working device in question is referenced, and a suitable post-work status flag or warning flag for the wafer 10 is obtained accordingly. In other words, the carrier 11 transports the wafer 10 up to each working device in each production process. The processing started in step S3 is followed by steps S4 through S6 in which the computing unit 3 verifies whether it is appropriate for the wafer 10 to be loaded to and processed by the working device in question.

The result of the check by the computing unit 3 is ascertained by the operator at the applicable input/output terminal (one of a, b, c, . . . , n) inside the clean room. The wafer 10 transported up to the working device in question is either loaded thereto or banned therefrom accordingly. The checking process above is repeated at every working device in every production process, whereby the occurrence of cross contamination is effectively forestalled.

Some variations of the production control apparatus 1 and the production control method according to the invention will now be described. In an actual semiconductor fabrication setup, one carrier 11 (FIG. 1) typically houses a plurality of wafers 10 that are transported collectively. The wafers 10 on the single carrier 11 may either be subject to the same processing or destined to undergo different kinds of work.

Another variation of the invention is a production control setup in which each carrier 11 accommodates a wafer that will undergo different kinds of work. In such a case, step S4 in the flowchart of FIG. 4 for reading the status flag from the workpiece is modified as follows: A status flag conversion table J1 shown in FIG. 5 is prepared beforehand in the storage unit 2 (FIG. 1). The modified step S4 then refers to the table J1 in determining the status flag to be read out.

The conversion table J1 in FIG. 5 consists of status flags attached on a plurality of wafers 10 falling into a first and a second group accommodated by a single carrier 11 (FIG. 1). The first group of wafers 10 represents one work status and the second group denotes another work status. A new status flag of a given wafer 10 is acquired for a given working device based on the status flags for the two groups.

For example, if the first group status flag is C and the second group status flag is W in the conversion table J1 in relation to a given working device, then a new status flag W is found at the point of intersection between the two status flags C and W in the table. In other words, the conversion table J1 serves to furnish a given wafer 10 with a new status flag reflecting the sum of the work status between the two groups.

Figure 4:
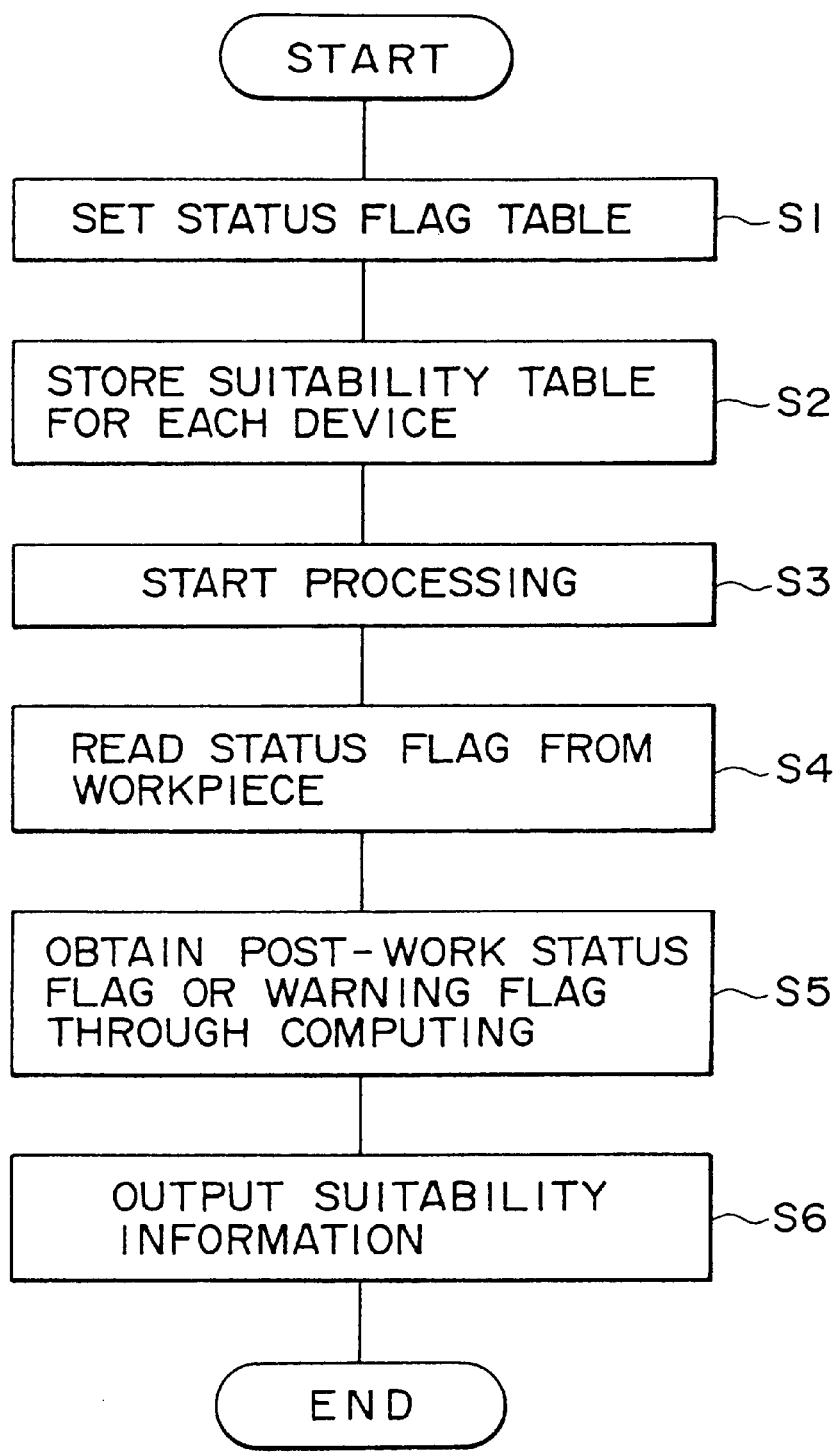
FIG. 4 is a flowchart of steps constituting a production control method also embodying the invention.

In step S5 of FIG. 4, the status flag acquired from the conversion is regarded as a pre-work status flag. Given that pre-work status flag, the computing unit 3 acquires through computing the post-work status flag or warning flag for the wafer 10 in relation to the working device in question. The computing is effected with reference to the applicable suitability table selected illustratively from among the tables T, T' and T" in FIG. 3 corresponding to the respective working devices.

If one carrier 11 (FIG. 1) transports three groups of wafers, a new status flag is first acquired from the first and the second groups of status flags in the conversion table J1. Then the newly acquired status flag is collated with the third group of status flags in the same manner as the first and the second groups of status flags were initially collated in the conversion table J1. Where there are four or more groups, status flag conversion may be carried out in like manner for every two groups.

Where one carrier 11 accommodates a plurality of wafers 10 that are subject to different kinds of work, the arrangements above make it possible automatically to verify whether each of the wafers 10 is allowed to be loaded to and processed by a given working device before entry thereinto. This ensures that the occurrence of cross contamination is forestalled.

In the setup of semiconductor fabrication, the probable cause of cross contamination is not limited to wafers 10 alone. Also important are measures to prevent cross contamination that can emanate from the carrier 11 transporting wafers 10. Some working devices may require that the carrier 11 carrying a wafer 10 be placed into their loader part upon loading of the wafer; other working devices may require an emptied carrier 11 to be set in their unloader part. In such cases, the carrier 11 needs to be properly controlled so that any pollution attached on the carrier will not spread over the production line.

To prevent cross contamination stemming from the carrier 11 involves providing a conversion table J2 of FIG. 6 in the storage unit 2 (FIG. 1). The conversion table J2 is used to effect conversion from a status flag of a lot (e.g., made of wafers 10 as a unit of transport) to a status flag of a carrier 11. Whereas wafers 10 are regarded as workpieces each furnished with a status flag for production control in the preceding examples, the carrier 11 may alternatively be regarded as a workpiece equipped with a status flag for controlled entry into each of the working devices configured.

Referencing the conversion table J2 makes it possible to obtain the status flag for the carrier 11 to be used on the basis of the lot status flags contained in the table. (Where one carrier 11 is associated with a plurality of groups of wafers, the status flag obtained from the conversion table J1 in FIG. 5 is used.)

For example, if the lot status flag is C, W, RC or RW in the conversion table J2, then the status flag for the carrier 11 is C. If the lot status flag is A or RA, the status flag for the carrier 11 is A. If the lot status flag is N, the status flag for the carrier 11 is also N.

As described, the status flag for the carrier 11 is acquired with respect to the prestored status flags for wafers 10. The processing involved is carried out in step S4 of the flowchart in FIG. 4. The status flag thus obtained is used as the basis for acquiring a post-work status flag or a warning flag in step S5. This allows any one of the input/output terminals a, b, c, . . . , n inside the clean room (FIG. 1) to judge whether the carrier 11 is used in conjunction with the working device in question without the possibility of cross contamination.

Although the examples above involved checking wafers 10 or other workpieces in the actual production setup to see if they are suitable for being loaded to and processed by a given working device before entry thereto, such cases are not limitative of the invention. Alternatively, the invention may be applied to preliminary checks at the stage of process design. In this case, the computing unit 3 of the production control apparatus 1 in FIG. 1 assumes a virtual production line. With wafers 10 or other workpieces assumed to make their progress in virtual fabrication, the computing unit 3 refers to the suitability table or the like established corresponding to each of the virtual working devices constituting the virtual production line. In so doing, the computing unit 3 acquires a post-work status flag or a warning flag for the workpiece in relation to the virtual working device in question.

The computing unit 3 proceeds automatically in the virtual production process and determines the suitability of a given workpiece regarding work by each of the working devices in the virtual process. If a warning flag is output instead of a post-work status flag at a given point, the computing unit 3 detects an error at that particular stage of process design and thus suspends the progress of the virtual production process for investigation. In this manner, the invention makes it possible to simulate checks for possible cross contamination during process design.

Although the description above has dealt primarily with the production control apparatus and method for use in producing semiconductor devices, this is not limitative of the invention. The invention also applies to apparatuses and methods for production control in fabricating other products.

The major benefits of the invention are summarized as follows: According to the production control apparatus embodying the invention, before the workpiece is loaded into a given working device, the computing means of the apparatus reads from the storage means the status flags of the workpiece and retrieves through computation either the post-work status flag or the warning flag corresponding to the status flags of the workpiece in relation to the working device in question. The post-work status flag or warning flag acquired by the computing means serves to determine automatically whether the workpiece is allowed to be loaded to and processed by the working device before access thereto without the possibility of cross contamination.

According to the production control method embodying the invention, before the workpiece in question is loaded into a given working device, the status flags attached in advance to the workpiece are read out, and either the post-work status flag or the warning flag associated with the status flags is acquired. The post-work status flag or warning flag thus obtained serves to determine automatically whether the workpiece is allowed to be loaded to and processed by the working device in question before access thereto without the possibility of cross contamination. The scheme significantly alleviates the burdens on process/device engineers charged with checking for possible cross contamination.

While preferred embodiments of the invention have been described using specific terms, such description is for illustrative purposes only, and it is to be understood that changes and variations may be made without departing from the spirit or scope of the following claims.

What is claimed is:

1. A production control apparatus for controlling whether to load a workpiece into a working device depending on the work status of said workpiece, said production control apparatus comprising:

storage means for storing status flags each indicating the work status of said workpiece, said storage means further storing either a post-work status flag indicating the work status in which said workpiece bearing said status flags will be after undergoing status-flag-designated processing by said working device, or a warning flag prohibiting the processing of said workpiece by said working device;

computing means cooperating with said storage means for reading from said storage means said status flags of said workpiece before said workpiece is loaded into said working device, said computing means further determining whether said workpiece is suitable for being loaded into said working device in accordance with either said post-work status flag or said warning flag corresponding to said status flags of said workpiece in relation to said working device; and output means cooperating with said computing means for outputting the result of the determining function by said computing means.

2. A production control apparatus according to claim 1 wherein said working device comprises an input/output terminal including:

input means for sending information to said computing means for computation thereby and to said storage means for storage therein; and output means for displaying stored information coming from said storage means and computed results from said computing means.

3. A production control apparatus according to claim 2, wherein said input means includes means for reading a code associated with said workpiece.

4. A production control apparatus according to claim 2, wherein said computing means includes input means for changing, adding and deleting information independently of said output means.

5. A production control apparatus according to claim 2 wherein said workpiece is a wafer and said working device is equipment for semiconductor fabrication.

6. A production control apparatus according to claim 5, wherein said input means and said output means are located in a clean room for said semiconductor fabrication, and said storage means and said computing means are located outside of said clean room.

7. A production control apparatus according to claim 6 wherein said wafer includes an identification code, and said input means includes a means for reading said identification code.

8. A production control method for determining whether to load a workpiece into a working device depending on the work status of said workpiece, said production control method comprising the steps of:

setting in advance status flags each indicating the work status of said workpiece;

storing either a post-work status flag indicating the work status in which said workpiece bearing said status flags will be after undergoing status-flag-designated processing by said working device, or a warning flag prohibiting the processing of said workpiece by said working device; and reading said status flags from said workpiece before said workpiece is loaded into said working device in order to determine whether said workpiece is suitable for being loaded into said working device in accordance with either said post-work status flag or said warning flag corresponding to said status flags of said workpiece in relation to the working device in question.

9. A production control method according to claim 8 wherein the step of storing further includes a step of storing suitability data related to at least one of said working devices, said post-work status flag being set corresponding to each status flag.

10. A production control method according to claim 9 wherein the step of reading includes a step of reading a bar code associated with said workpiece.

11. A production control method according to claim 10 wherein the step of reading includes a step of reading a bar code associated with a plurality of said workpieces.

12. A production control method according to claim 9 further including the steps of:

sending information to a computer unit during a computing step for computation and to a storage unit for storage therein; and displaying information from said storage unit and from said computer unit.

13. A production control method according to claim 8 wherein said workpiece is a wafer and said working device is an apparatus for making a semiconductor from said wafer.

14. A production control apparatus for controlling whether to load a workpiece into a working device depending on the work status of said workpiece, said production control apparatus comprising:

a storage unit storing status flags each indicating the work status of said workpiece, said storage unit further storing either a post-work status flag indicating the work status in which said workpiece bearing said status flags will be after undergoing status-flag-designated processing by said working device, or a warning flag prohibiting the processing of said workpiece by said working device;

a computing unit cooperating with said storage unit for reading from said storage unit said status flags of said workpiece before said workpiece is loaded into said working device, said computing unit further determining whether said workpiece is suitable for being loaded into said working device in accordance with either said post-work status flag or said warning flag corresponding to said status flags of said workpiece in relation to said working device; and an output cooperating with said computing means for outputting the result of the determining function by said computing means.

15. A production control apparatus according claim 14 wherein said working device comprises an input/output terminal including:

an input portion for sending information to said computing unit for computation thereby and to said storage units for storage therein; and an output portion for displaying stored information coming from said storage unit and computed results from said computing unit.

16. A production control apparatus according to claim 15 wherein said input portion includes means for reading a code associated with said workpiece.

17. A production control apparatus according to claim 14 wherein said computing unit includes an input for changing, adding and deleting information independently of said output means.

* * * * *